United States Patent [19]

Hashiguchi

[11] Patent Number: 4,920,479
[45] Date of Patent: Apr. 24, 1990

[54] MULTIPROCESSOR SYSTEM WITH STORAGE CONTROL UNITS INCLUDING BUFFER STORAGE UNITS COMPRISING AN ERROR RECOVERY SYSTEM FOR STORAGE CONTROL UNITS

[75] Inventor: Tatsuro Hashiguchi, Tokyo, Japan

[73] Assignee: NEC Corporation, Tokyo, Japan

[21] Appl. No.: 160,757

[22] Filed: Feb. 26, 1988

[30] Foreign Application Priority Data

Feb. 28, 1987 [JP] Japan .................. 62-44079

[51] Int. Cl.⁵ .......................................... G06F 11/16
[52] U.S. Cl. ................................. 364/200; 364/265; 364/266.5; 371/9.1
[58] Field of Search ...................... 371/9, 10; 364/200 MS File, 900 MS File

[56] References Cited

U.S. PATENT DOCUMENTS

| | | | |
|---|---|---|---|
| 4,099,241 | 7/1978 | Ossfeidt | 371/9 |
| 4,351,023 | 9/1982 | Richer | 371/9 |
| 4,371,754 | 2/1983 | De et al. | 371/9 |
| 4,443,849 | 4/1984 | Ohwada | 371/9 |
| 4,466,098 | 8/1984 | Southard | 371/9 |
| 4,511,982 | 4/1985 | Kurakake | 371/9 |
| 4,581,701 | 4/1986 | Hess et al. | 371/9 |
| 4,684,885 | 8/1987 | Chapman | 371/9 |
| 4,700,292 | 10/1987 | Campanini | 371/9 |
| 4,751,702 | 6/1988 | Beier et al. | 371/9 |

Primary Examiner—David Y. Eng
Attorney, Agent, or Firm—Foley & Lardner, Schwartz, Jeffery, Schwaab, Mack, Blumenthal & Evans

[57] ABSTRACT

In a multiprocessor system having a first and a second storage control units with a first and a second buffer storages of a store-in type, respectively, for connecting a plurality of execution processor units to main storage units, a first diagnostic processor controls a reading circuit to read out first buffer data from the first buffer storage, upon occurrence of an error caused in the first storage control unit having the first buffer storage currently connected to a first of main storage units. The read-out first buffer data are transferred to a second diagnostic processor which, in turn, makes a writing circuit to write the read-out first buffer data into the second buffer storage to enable any one of the execution processor units to use the first buffer data after occurrence of the error. Prior to writing operation of the read-out first buffer data into the second buffer storage, the second diagnostic processor makes the second storage control unit store second buffer data from the second buffer storage into a second of main storage units currently connected to the second buffer storage. After completion of the writing operation, the second buffer storage is connected to the first main storage unit in place of the second main storage unit.

6 Claims, 2 Drawing Sheets

MULTIPROCESSOR SYSTEM WITH STORAGE CONTROL UNITS INCLUDING BUFFER STORAGE UNITS COMPRISING AN ERROR RECOVERY SYSTEM FOR STORAGE CONTROL UNITS

BACKGROUND OF THE INVENTION

(1) Field of the Invention

The present invention relates to an error recovery system for use in a multiprocessor system, and in particular, to an error recovery system having storage control units with buffer storages in the multiprocessor system.

(2) Description of the Prior Art

The multiprocessor system comprises one or more main storage units for storing data including programs, a plurality of central processor units for processing the programs. Each of the central processor units comprises a plurality of execution processor units for executing the programs and a system control unit or storage control unit through which the execution processor units are coupled with the main storage unit. In order to reduce access times to the main storage unit, the storage control unit is provided with a buffer storage of a store-in type for storing, as buffer data, blocks of data read out from the main storage unit. The buffer storage is often called a cache memory.

Data required for executing programs at the execution processor units are read out from the buffer storage. When data required for the execution processor units are absent in the buffer storage, the storage control unit reads the required data from the main storage unit into the buffer storage. When the buffer storage has no vacant portion, the storage control unit transfers one or more data units from the buffer storage into the main storage unit to form a vacant portion prior to the reading operation from the main storage unit.

When a result of the program execution should be stored in the main storage unit so as to renew one or more units of the data, one or more units of the buffer data are only renewed into the result but data stored in the main storage unit are not renewed because the buffer storage is of the store-in type. Renewing for the main storage unit is carried out by the above-described data transfer from the buffer storage to the main storage unit.

Therefore, the buffer data in the buffer storage are usually different from the contents of the main storage unit.

In the multiprocessor system, the buffer data cannot be stored from the buffer storage into the main storage unit when an error or hardware failure occurs at any portion of the storage control unit. Therefore, even if the buffer data are normal, it is not possible to use the buffer data thereafter so that the system goes down.

U.S. Pat. No. 4,443,849 by Ohwada, assigned to Nippon Electric Co. Ltd. discloses an error recovery system for use in the multiprocessor system wherein, on occurrence of an error at a processor executing a program, status signals related to the program are transferred through a storage circuit in a diagnostic unit to another processor so that the other processor takes over execution of the program. This U.S. Patent also discloses transferring the status signals to the other processor through the main storage unit. The error recovery is called a processor relief technique. However, an error caused in the storage control unit cannot be recovered by the processor relief technique because the buffer data cannot be used in any one of the processors.

SUMMARY OF THE INVENTION

It is an object of the present invention to provide an error recovery system for use in a multiprocessor system having storage control means with buffer storage means which enables use of the normal buffer data in the buffer storage means even when an error occurs at the storage control means.

An error recovery system according to the present invention is applicable to a multiprocessor system comprising a first and a second main storage means for storing first and second data each including programs, respectively, and a first and a second storage control means coupled to the first and the second main storage means, respectively. The first and the second storage control means comprises a first and a second buffer storage means of a store-in type being operatively coupled to a particular one of the first and the second main storage means and a remaining one of the first and the second main storage means, respectively. The first and the second buffer storage means store, as first and second buffer data, blocks of data read out from the particular one and the remaining one of the first and the second main storage means, respectively. A plurality of execution processor means are coupled to the first and the second storage control means and execute programs in the first and the second buffer storage means. The first and the second storage control means control data transfer between particular one of the first and the second main storage means and the first buffer storage means and between the remaining one of the first and the second main storage means and the second buffer storage means, respectively. The first and the second storage control means further control data transfer between the first buffer storage means and the executing means and between the second buffer storage means and the execution processor means, respectively. The error recovery system comprises error detection means coupled with the first storage control means for detecting an error caused in the first storage control means with the first buffer storage means operating normally to produce a reading signal, reading means responsive to the reading signal for reading out the first buffer data from the first buffer storage means to deliver the first buffer data as read-out data, transmitting means coupled to the reading means for transmitting the read-out data, receiving means for receiving the read-out data transmitted from the transmitting means to produce the read-out data as write-in data, and writing means for writing the write-in data in the second buffer storage means.

The error recovery system further comprises signal producing means coupled with the receiving means for producing a storing signal when the receiving means receives the read-out data. The second storage control means responsive to the storing signal transfers the second buffer data into the remaining one of the first and the second main storage means prior to writing of the write-in data into the second buffer storage means.

The signal producing means produces a changing signal when the writing operation of the write-in data is completed. The second storage control means connects the particular one of the first and the second main storage means to the second buffer storage means and disconnects the remaining one of the first and the second main storage means from the second buffer storage means in response to the changing signal.

DESCRIPTION OF PREFERRED EMBODIMENTS

Figure 1:
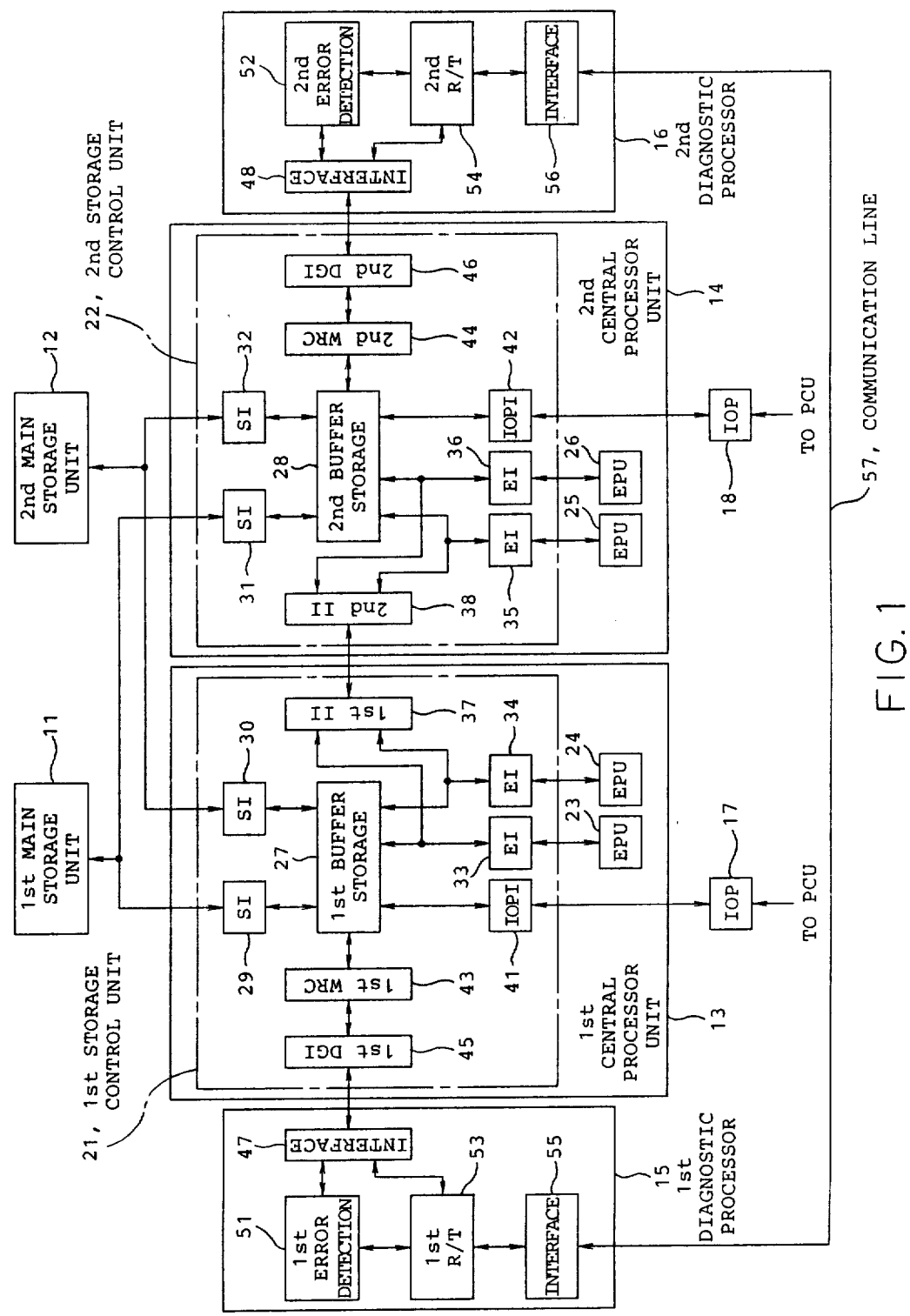
FIG. 1 is a schematic block diagram view illustrating a multiprocessor system with an error recovery system according to one embodiment of the present invention.

Referring to FIG. 1, a multiprocessor system shown therein comprises first and second main storage units 11 and 12 for storing first and second data each including programs, first and second central processor units 13 and 14 for processing the programs, and first and second diagnostic processors 15 and 16 connected to the first and the second central processor units 13 and 14, respectively. The first and the second central processor units 13 and 14 are connected to a plurality of input output processors (IOP) shown at 17 and 18, respectively, which are also connected to peripheral control units (PCU) in the similar manner as in the prior art.

The first and the second central processor units 13 and 14 comprise first and a second storage control units 21 and 22, respectively, and a plurality of execution processor units (EPU), four EPUs being shown at 23 through 26.

The first and the second storage control units 21 and 22 comprise first and second buffer storage 27 and 28 of a store-in type, operatively coupled with the first and the second main storage units 11 and 12 through storage interfaces (SI) shown at 29 through 32, respectively. Each of the first and the second buffer storages 27 and 28 is for storing blocks of data read out from the one of the first and the second main storage units 21 and 22 which is currently coupled thereto.

The execution processor units 23 and 24 are connected to the first buffer storage 27 through execution interfaces (EI) 33 and 34, respectively, while the other execution processor units 25 and 26 are also connected to the second buffer storage 28 through execution interfaces (EI) 35 and 36, respectively. The execution processor units 23 and 24 are further connected to the second buffer storage 28 through a first and a second interunit interface (II) 37 and 38, while the other execution processor units 25 and 26 are also connected to the first buffer storage 27 through the first and the second interunit interfaces 37 and 38.

The first storage control unit 21 controls connection of the first buffer storage unit 27 to one of the first and the second main storage units 11 and 12 as a particular main storage unit, data transfer between the first buffer storage 27 and the particular main storage unit, and data transfer between the first buffer storage 27 and any one of the execution processor units 23–26. The second storage control unit 22 also controls connection of the second buffer storage unit 28 to one of the first and the second main storage units 11 and 12 as a specific main storage unit, data transfer between the second buffer storage 28 and the specific main storage unit, and data transfer between the second buffer storage unit 28 and any one of the execution processor units 23–26.

In the figure, IOP interfaces (IOPI) 41 and 42 are for connecting the input output processor units 17 and 18 to the first and second buffer storage unit 27 and 28, respectively.

Now, providing that the first main storage unit 11 is operatively connected to the first buffer storage unit 27 as the particular main storage unit while the second main storage unit 12 is operatively connected to the second buffer storage unit 28 as the specific main storage unit, blocks of data are transferred from the first and the second main storage units 11 and 12 into the first and the second buffer storage units 27 and 28 as first and second buffer data, respectively.

When one of the execution processor units, for example, the execution processor unit 23 executes a program contained in the first buffer data stored in the first buffer storage 27, the execution processor unit 23 reads out data from the first buffer storage 27 which are required for executing the program. When a result executed at the execution processor unit 23 needs to be stored, the result is only stored in the first buffer storage unit 27 to renew one or more data units in the first buffer storage unit 27 because the first buffer storage unit 27 is of the stored-in type. Then, the data in the particular main storage unit are not renewed. Accordingly, the first buffer data in the first buffer storage unit 27 are usually different from contents in the particular main storage unit, or the first main storage unit 11.

When the data necessary for executing the program are absent in the first buffer storage unit 27, the first storage control unit 21 reads out the necessary data from the particular main storage unit 11 into the first buffer storage unit 27. When the first buffer storage unit 27 has no vacant portion, the storage control unit 21 transfers data from the first buffer storage unit 27 into the particular main storage unit 11 to thereby make a vacant portion in which the necessary data read out from the particular main storage unit 11 can be stored. Then, the data in the particular main storage unit 11 are resultantly renewed.

When an error occurs in the execution processor unit 23 during executing a program, the execution is taken over by another execution processor unit by the processor relief technique as described in the prior art. However, when an error occurs in the first storage control unit 21, the first buffer data in the first buffer storage unit 27 cannot be stored in the particular main storage unit 11, so that the first buffer data in the first buffer storage unit 27 cannot be used by any one of the execution processor units 23–26. As a result, the system goes down even if the system is provided with the processor relief means.

In order to resolve such a problem, the multiprocessor system comprises a recovery system for an error of one in the first and the second storage control units 21 and 22.

The recovery system comprises the first and the second diagnostic processors 15 and 16 connected to the first and second storage control units 21 and 22, respectively, and first and second writing and reading circuits (WRC) 43 and 44 provided in the first and the second storage control units 21 and 22, respectively.

The first and the second diagnostic processors 15 and 16 are connected to first and second diagnostic interfaces (DGI) 45 and 46 in the first and the second storage control units 21 and 22 through interfaces 47 and 48, respectively. The first and the second diagnostic processors 15 and 16 comprises first and second error detection circuits 51 and 52 for detecting errors of the first and the second storage control units 21 and 22, respectively, and first and second data receivers and transmitters (R/T) 53 and 54. The first and the second data receivers and transmitters 53 and 54 are connected to each other through interfaces 55 and 56 and a communication line 57.

When the first error detection circuit 51 detects an error of the first storage control unit 21, the first error detection circuit 51 confirms the fact that the first buffer data stored in the first buffer storage unit 27 are not damaged but remain normal. Thereafter, the first error detection circuit 51 produces an error signal. Then, the multiprocessor system suspends the processing operation.

Thereafter, the first error detection circuit 51 produces a reading signal to make the first writing and reading circuit 43 read out all of the first buffer data from the first buffer storage unit 27 to the data receiver and transmitter 53. The read-out first buffer data are transmitted by the first data receiver and transmitter 53 to the second data receiver and transmitter 54 through the interfaces 55 and 56 and the communication line 57.

When the second data receiver and transmitter 54 receives the read-out first buffer data from the first diagnostic processor 15, the second error detection circuit 52 in the second diagnostic processor 16 produces a storing signal to make the second storage control unit 22 transfer the second buffer data from the second buffer storage unit 28 into the specific, or the second, main storage unit 12. Thereafter, the read-out first buffer data received at the second data receiver and transmitter 54 are written in the second buffer storage 28 by the second writing and reading circuit 44. After the writing operation is completed, the second error detection circuit 52 produces a changing signal to make the second storage control unit 22 control the storage interfaces 31 and 32 so as to operatively connect the first main storage unit 11 to the second buffer storage unit 28 and disconnect the second storage unit 12 from the second buffer storage unit 28.

Thus, execution of the program at the execution processor unit 23 can be restarted using the data in the second buffer storage unit 28 and the first main storage unit 11.

Although the above description has been made in connection with an error of the first storage control unit 21, error recovery of the second storage control unit 17 is carried out in the similar manner as described above. That is, when an error occurs at the second storage control unit 22, the second buffer data stored in the second buffer storage unit 28 are read out by the second writing and reading circuit 44 under control of the second diagnostic processor unit 16 and are transferred to the first data receiver and transmitter 53. Then, the second buffer data are written into the first buffer storage unit 27 by the first writing and reading circuit 43 under control of the first diagnostic processor 15. Then, the second main storage unit 12 is connected in place of the first main storage unit 11.

Figure 2:
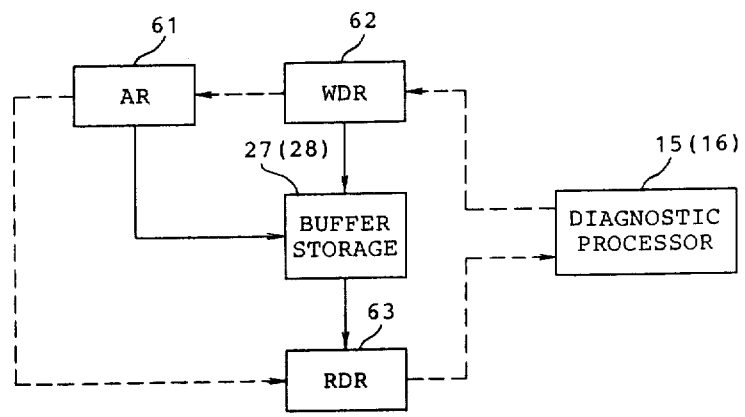
FIG. 2 is a schematic diagram view of writing and reading circuits for a buffer storage unit under control of an error diagnostic processor.

Referring to FIG. 2, an example of each of the first and the second writing and reading circuits 43 and 44 is shown together with the buffer storage unit 27 (28) and the diagnostic processor 15 (16). The writing and reading circuit comprises an address register (AR) 61, a writing data register (WDR) 62, and a reading data register (RDR) 63, each connected to the buffer storage unit 27 (28). Those registers 62, 61, and 63 are implemented by flip flops and are connected in series with one another to form a shift register having an input and an output port. The input and the output ports are connected to the diagnostic processor 15 (16) to form a closed loop, as indicated by dashed lines in the figure.

In the operation for writing the buffer storage 27 (28) from the diagnostic processor 15 (16), the diagnostic processor 15 (16) sequentially delivers writing address data and write-in data to the writing data register 62 through the input port. The writing address data and the write-in data are shifted in the writing data register 62 until the writing address data are set in the address register 61 and the write-in data are set in the writing data register 62. Then, the write-in data are stored at an address in the buffer storage unit 27 (28) indicated by the address data. The writing operation is repeated to complete writing of all of the data which are received at the receiver and transmitter 53 (54) of the diagnostic processor 15 (16).

In the reading operation, reading address data are delivered from the diagnostic processor 15 (16) to the writing data register 62 through the input port, and are shifted through the writing data register 62 until the reading address data are set in the address register 61. Then, data at an address in the buffer storage unit 27 (28) indicated by the address data are read out into the reading data register 63. Then, the read-out data are shifted out from the reading data register 63 to the diagnostic processor 15 (16). The reading operation is repeated until all of the buffer data stored in the buffer storage unit 27 (28) are read out.

What I claim is:

1. In an error recovery system for used in a multiprocessor system comprising a first and a second main storage means for storing first and second data each including programs, respectively, a first and a second storage control means coupled to said first and said second main storage means, respectively, said first and second storage control means comprising a first and a second buffer storage means of a store-in type operatively coupled to a particular one of said first and said second main storage means and a remaining one of said first and said second main storage means, respectively, said first and said second buffer storage means storing, as first and second buffer data, blocks of data read out from said particular one and said remaining one of said first and said second main storage means, respectively, and a plurality of execution processor means coupled to said first and said second storage control means for executing programs in said first and said second buffer storage means, said first and said second storage control means controlling data transfer between said particular one of said first and said second main storage means and said first buffer storage means and between said remaining one of said first and said second main storage means and said second buffer storage means, respectively, said first and said second storage control means further controlling data transfer between said first buffer storage means and said execution processor means and between said second buffer storage means and said execution processor means, respectively, the improvement which comprises:

error detection means coupled with said first storage control means for detecting an error caused at any portion in said first storage control means during a period when a particular one of said plurality of execution processor means executes, as a current program, a program in said first buffer data, said error detection means producing a reading signal when confirming that said first buffer storage means is normal on detection of said error;

reading means responsive to said reading signal for reading out said first buffer data from said first buffer storage means to deliver said first buffer data as read-out data;

transmitting means coupled to said reading means for transmitting said read-out data;

receiving means coupled to said transmitting means for receiving said read-out data through said transmitting means to produce said read-out data as write-in data;

signal producing means coupled with said receiving means for producing a storing signal when said receiving means receives said write-in data; and writing means responsive to said storing signal writing and write-in data in said second buffer storage means to thereby enable said particular execution processor means to restart the execution of said current program by use of said write-in data stored in said second buffer storage means;

said second storage control means responsive to said storing signal for transferring said second buffer data into said remaining one of said first and said second main storage means prior to writing of said write-in data into said second buffer storage means by said writing means.

2. An error recovery system as claimed in claim 1, wherein said signal producing means produces a changing signal when said writing operation of said write-in data is completed, said second storage control means connecting said particular one of said first and said second main storage means to said second buffer storage means and disconnecting said remaining one of said first and said second main storage means from said second buffer storage means in response to said changing signal.

3. In an error recovery system for use in a multiprocessor system comprising a first and a second main storage means for storing first and second data each including programs, respectively, a first and a second storage control means coupled to said first and said second main storage means, respectively, said first and second buffer storage means of a store-in type operatively coupled to a particular one of said first and said second main storage means and a remaining one of said first and said second main storage means, respectively, said first and said second buffer storage means storing, as first and second buffer data, blocks of data read out from said particular one and said remaining one of said first and said second main storage means, respectively, and a plurality of execution processor means coupled to said first and said second storage control means for executing programs in said first and said second buffer storage means, said first and said second storage control means controlling data transfer between said particular one of said first and said second main storage means and said first buffer storage means and between said remaining one of said first and said second main storage means and said second buffer storage means, respectively, said first and said second storage control means further controlling data transfer between said first buffer storage means and said executing means and between said second buffer storage means and said execution processor means, respectively, the improvement which comprises:

first writing and reading means for writing first write-in data into said first buffer storage means and for reading said first buffer data from said first buffer storage means;

second writing and reading means for writing second write-in data into said second buffer storage means and for reading said second buffer data from said second buffer storage means;

first diagnostic means coupled to said first storage control means for detecting an error caused in said first storage control means and controlling said first storage control means and said first writing and reading means;

second diagnostic means coupled to said second storage control means for detecting an error caused in said second storage control means and controlling said second storage control means and said second writing and reading means; and communication means connecting said first and said second diagnostic means to each other for enabling data communication between said first and said second diagnostic means;

said first diagnostic means producing a first reading signal to make said first writing and reading means read said first buffer data as read-out first buffer data when said first diagnostic means detects an error caused at any portion in said first storage control means other than said first buffer storage means during a period when a particular one of said plurality of execution processor means executes, as a particular program, a program in said first buffer data, said first diagnostic means transmitting said read-out first buffer data to said second diagnostic means through said communication means said second diagnostic means responsive to said read-out first buffer data for making said second storage control means transfer said second buffer data into said remaining one of said first and said second main storage means and then supplying to said second writing and reading means, as said second write-in data, said read-out first buffer data so as to make said second writing and reading means write said second write-in data into said second buffer storage means to thereby enable said particular execution processor means to restart the execution of said particular program by use of said second write-in data stored in said second buffer storage means.

4. An error recovery system as claimed in claim 3, wherein said first writing and reading means comprises first writing data register means, first address register means, and first reading data register means which are connected in series with one another to form a first shift register having a first input port and a first output port both connected to said first diagnostic means, each of said first writing data register means being connected to said first buffer storage means, said first diagnostic means delivering and shifting said first write-in data together with first writing address data in said first shift register through said first input port so as to set said first write-in data and said first writing address data into said first writing data register means and said first address register means to thereby enable writing of said first write-in data in said first buffer storage means, said first diagnostic means delivering and shifting first reading address data in said first shift register through said first input port so as to set said first reading address data into said first address register means to thereby enable reading of said first buffer data from said first reading data register means, said read-out first buffer data being shifted out from said first reading data register means into said first diagnostic means.

5. An error recovery system as claimed in claim 3, wherein said second diagnostic means producing a second reading signal to make said second writing and reading means read said second buffer data as read-out second buffer data when said second diagnostic means detects an error caused at any portion in said second storage control means other than said second buffer storage means during a period when a specific one of said plurality of execution processor means executes, as a specific program, a program in said second buffer data, said second diagnostic means transmitting said read-out second buffer data to said first diagnostic means through said communication means;

said first diagnostic means responsive to said read-out second buffer data for making said first storage control means transfer said first buffer data into said particular one of said first and said second main storage means and then supplying to said first writing and reading means, as said first write-in data, said read-out second buffer data so as to make said first writing and reading means write said first write-in data into said first buffer storage means to thereby enable said specific execution processor means to restart the execution of said specific program by use of said first write-in data stored in said first buffer storage means.

6. An error recovery system as claimed in claim 5, wherein said second writing and reading means comprises second writing data register means, second address register means, and second reading data register means which are connected in series with one another to form a second shift register having a second input port and a second output port both connected to said second diagnostic means, each of said second writing data register means, said second address register means, and said second reading data register means being connected to said second buffer storage means, said second diagnostic means delivering and shifting said second write-in data together with second writing address data in said second shift register through said second input port so as to set said second write-in data and said second writing address data into said second writing data register means and said second address register means, respectively, to thereby enable to write said second write-in data in said second buffer storage means, said second diagnostic means delivering and shifting second reading address data in said second shift register through said second input port so as to set said second reading address data into said second address register means to thereby enable to read said second buffer data into said second reading data register means, said read-out second buffer data being shifted out from said second reading data register means into said second diagnostic means.

* * * * *